United States Patent [19]
Srinivasan et al.

[11] Patent Number: 5,680,047
[45] Date of Patent: Oct. 21, 1997

[54] MULTIPL-TUNED RADIO FREQUENCY COIL FOR SIMULTANEOUS MAGNETIC RESONANCE IMAGING AND SPECTROSCOPY

[75] Inventors: Ravi Srinivasan, Richmond Hts; Haiying Liu, Euclid; Robert A. Elek, Chardon, all of Ohio

[73] Assignee: Picker International, Inc., Highland Heights, Ohio

[21] Appl. No.: 514,396

[22] Filed: Aug. 11, 1995

[51] Int. Cl.$^6$ .................................................. G01V 3/00
[52] U.S. Cl. ................................. 324/318; 128/653.5
[58] Field of Search ........................... 324/318, 322, 324/314, 307, 309; 128/653.2, 653.5

[56] References Cited

U.S. PATENT DOCUMENTS

| | | | |
|---|---|---|---|
| 4,799,016 | 1/1989 | Rezvani | 324/318 |
| 5,041,790 | 8/1991 | Tropp et al. | 324/318 |
| 5,057,778 | 10/1991 | Rath | 324/318 |
| 5,144,241 | 9/1992 | Oppelt et al. | 324/318 |
| 5,202,635 | 4/1993 | Srinivasan et al. | 324/318 |
| 5,280,249 | 1/1994 | Kess | 324/318 |

FOREIGN PATENT DOCUMENTS

WO92/02835  2/1992  WIPO.

OTHER PUBLICATIONS

"Doubly Tuned Solenoidal Resonators For Small Animal Imaging and Spectroscopy at 1.5 Tesla", Ballon, et al., Magnetic Resonance Imaging, vol. 7, pp. 155–162, 1989.

"Dual Frequency Matched Surface Coil", Keren, et al., SMRM Seventh Annual Meeting, Aug. 20–26, 1988, San Francisco, CA p. 108.

"Doubly Tuned Loal Coils for MRI and MRS at 1.5 T°", Grist, et al., Magnetic Resonance in Medicine, 6, 253–264 (1988).

"Two Configurations of the Four-Ring Birdcage Coil for $^1$H Imaging and $^1$H-Decoupled $^{31}$P Spectroscopy of the Human Head", Murphy-Boesch, et al. Journal of Magnetic Resonance, Series B, 103 (1994) Feb. No. 2, pp. 103–114.

"The Signal-to-Noise Ratio of the Nuclear Magnetic Resonance Experiment", Hoult, et al., J. Mag. Res. 24, 71–75 (1976).

"A New Double-Tuned Probe For Concurrent $^1$H and $^{31}$P NMR", Schnall, et al., J. Mag. Res. 65, 122–129 (1985).

(List continued on next page.)

Primary Examiner—Louis M. Arana
Attorney, Agent, or Firm—Fay, Sharpe, Beall, Fagan, Minnich & McKee

[57] ABSTRACT

A magnetic resonance system is used to excite high γ dipoles, such as hydrogen, and lower γ dipoles, such as phosphorous, to resonate concurrently. A multiply-tuned radio frequency coil (40) is disposed around the region of interest. The multiply-tuned radio frequency coil is tuned to the resonance frequency of the high γ dipoles and the resonance frequency of the low γ dipoles. The coil has an inner coil section, defined by a first leg or ring (92) and a second leg or ring (94), which is tuned by added capacitance substantially to the resonance frequency of the low γ dipole. A first outer coil section which is defined by a third leg or ring (90) and the first leg or ring. A second outer coil section defined by the second leg or ring (94) and a fourth leg or ring (96). The first and second outer sections, together with the inner coil section define a coil which has a co-rotating mode and a counter-rotating mode. Added capacitance is sized such that one of the co-rotating and counter-rotating modes is at the high γ resonance frequencies. In this manner, a multiply-tuned radio frequency coil is defined which is simultaneously tuned to at least two resonance frequencies. Separate pick-ups (130, 132) for the high and low resonance frequencies enable both signals to be received (66, 70) simultaneously for reconstruction (74) into image representations.

24 Claims, 7 Drawing Sheets

OTHER PUBLICATIONS

"Doubly–Tuned Solenoidal Resonators For High Spatial Resolution Small Animal Imaging and Spectrscopy", Ballon, et al., Abstract SMRM 7th Annual Meeting, Aug. 20–28 1988, San Francisco, CA.

"Doubley Tuned Solenoidal Resonators For Small Animal Imaging and Spectroscopy at 1.5 Tesla", Ballon, et al., Mag. Res. Imaging, V. 7 pp. 155–162 (1989).

"Proton–Decoupled $^{31}$P Chemical Shift Imaging of the Human Brain in Normal Volunteers", Murphy–Boesch, et al., NMR in BioMedicine, V. 6, 173–180 (1993).

"Simultaneous and Interleaved Multinuclear Chemical–Shift Imaging, a Method For Concurrent, Localized Spectroscopy", Gonen, et al., J. Mag. Res. Series B, 104, 26–33 (1994).

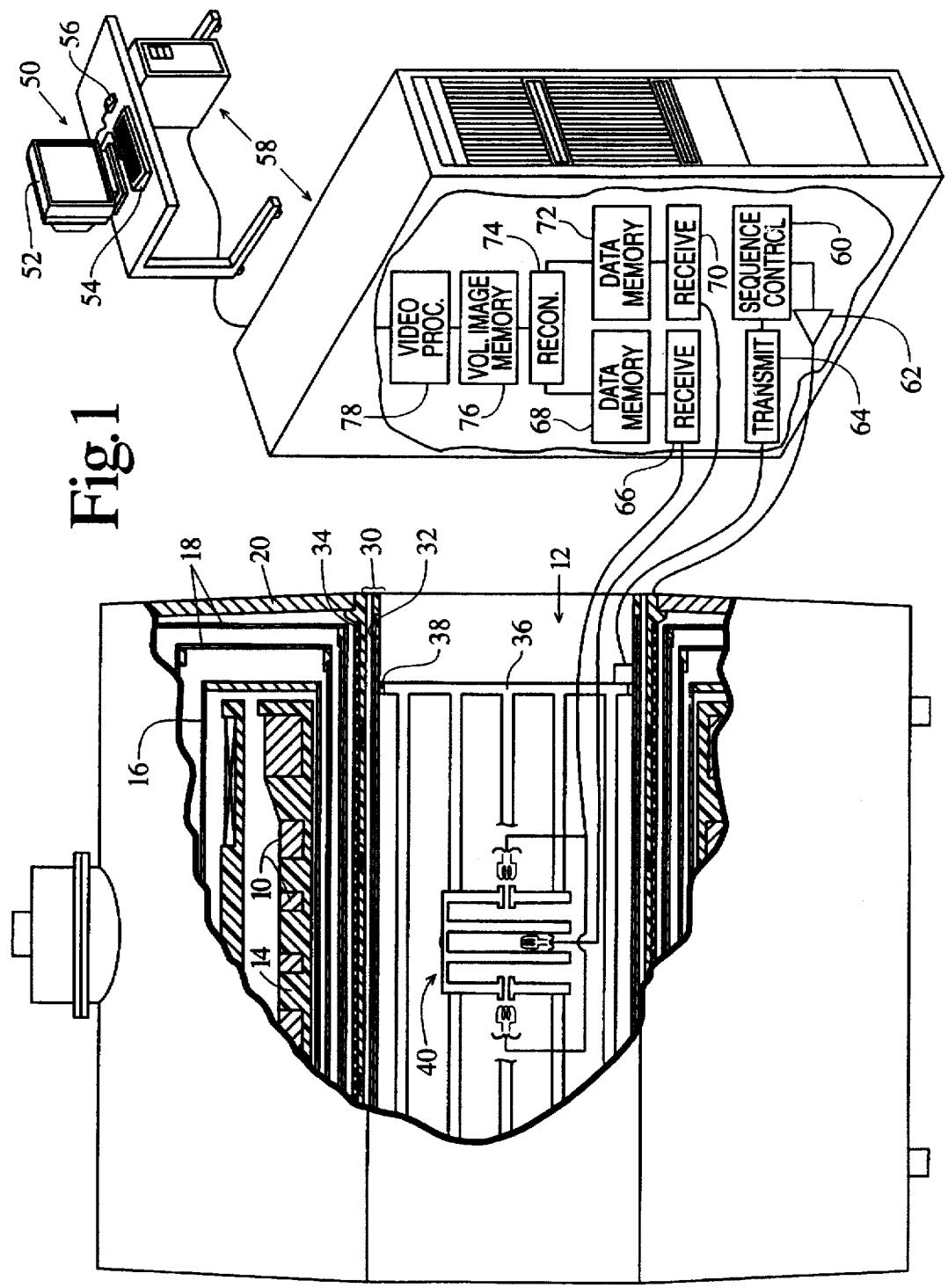

MULTIPL-TUNED RADIO FREQUENCY COIL FOR SIMULTANEOUS MAGNETIC RESONANCE IMAGING AND SPECTROSCOPY

BACKGROUND OF THE INVENTION

The present invention relates to the magnetic resonance arts. It finds particular application in conjunction with a radio frequency magnetic resonance imaging coil which is tuned to the resonance frequencies of phosphorous and hydrogen (or other dipoles of interest) without added trap circuits, and will be described with particular reference thereto. It is to be appreciated, however, that the invention will also find application in animal studies, non-human studies, high resolution in-vitro cell culture and profusion studies, and the like. The coil may also be used in transmit and receive modes, in transmit only modes, in receive only modes and may be used in conjunction with local gradients for high resolution imaging as well as spectroscopy.

In magnetic resonance imaging, the frequency magnetic resonance signal is proportional to the gyromagnetic ratio $\gamma$ of the dipole(s) of interest. In a 1.5 Tesla magnetic field, hydrogen dipoles $^1$H have a resonance frequency of 64 MHz. There are typically other dipoles in the examination region with markedly different resonance frequencies, e.g., phosphorous $^{31}$P with a resonance frequency about 24 MHz. The radio frequency coil is commonly tuned to the magnetic resonance frequency of the selected dipole of interest, 64 MHz for hydrogen or proton imaging. In order to image two dipoles concurrently, the radio frequency coil would be tuned to two resonance frequencies, e.g., the resonance frequencies of hydrogen and the resonance frequency of phosphorous. See, for example, "The Signal-To-Noise Ratio of the Nuclear Magnetic Resonance Experiment", Hoult, et al., J. Mag. Res. 24, 71–85 (1976).

In order to achieve double-tuning of the radio frequency coil, traps, such as a parallel LC trap, were added in series with the tuning capacitor. See, for example, "A New Double-Tuned Probe for Concurrent $^1$H and $^{31}$P NMR", Schnall, et al., J. Mag. Res. 65, 122–129 (1985). Traps, whether parallel, series, or a combination thereof, are added circuitry. Although the traps enable the coil to be double-tuned to two resonance frequencies, they do not contribute to the $B_1$ radio frequency field at either frequency. To the contrary, the traps consume radio frequency energy and add to coil losses reducing overall coil performance. Moreover, the Schnall design was not suited to proton decoupling experiments and was therefore not amenable to simultaneous hydrogen and phosphorous signal reception.

Another doubly-tuned coil design which utilizes four parallel wind solenoid coils is described in "Doubly-Tuned Solenoidal Resonators For Small Animal Imaging and Spectroscopy At 1.5 Tesla", Ballon, et al., Mag. Res. Imaging, 7, 155–162 (1989) and "Doubly-Tuned Solenoidal Resonators For High Spatial Resolution Small Animal Imaging and Spectroscopy", Ballon, et al., SMRM 7th Annual Meeting, Book of Abstracts, p. 861 (1988). This solenoidal coil design had several resonant modes including (1) a parallel mode in which the currents in all four turns were in-phase and (2) an anti-parallel mode in which the currents in the two outer turns were out-of-phase with respect to the currents in the two inner turns. The parallel mode, which has the larger field-of-view was at the lower resonance frequency and the anti-parallel mode with the narrower field-of-view was at the higher resonance frequency. Generally, the proton mode with a larger field-of-view than the low $\gamma$ nucleus is preferred for (1) obtaining a homogeneous image, (2) shimming over a larger volume, and (3) uniform proton decoupling over the proton mode field-of-view. These all promote obtaining quality x-nucleus spectra. Ballon added additional external tuning circuits in order to cause the parallel mode to resonate at the higher hydrogen frequency and the anti-parallel mode to resonate at the lower phosphorous frequency. In this manner, added tuning traps were needed to produce both resonance frequency modes.

In the Ballon design, the hydrogen dipole field was relatively homogeneous. The hydrogen dipole field was relatively homogeneous due to a large fraction of the currents flowing in the inner turns. However, the strength of the $B_1$ radio frequency field at the phosphorous frequency was reduced appreciably at the center by the opposite polarity contribution of the two outer rings. The $^{31}$P radio frequency field was reduced at the center due to the equal but 180° out-of-phase currents in the outer turns. This not only caused a reduction in the phosphorous $B_1$ radio frequency field at coil center, but also forced nulls between each of the inner turns and its nearest neighbor outer turns. These nulls caused rapidly decreasing $^{31}$P resonance frequency fields in the sample region that was disposed between the inner and their nearest neighbor outer turns. That is, little or no phosphorous resonance signals were received from tissues disposed in the examination region in the slice or slab between each pair of inner and outer turns. These nulls thus cause an unacceptable dirth of $^{31}$P resonance signals over portions of the field-of-view.

Again, the external tuning circuits that were used to reverse the order of the parallel and anti-parallel modes do not contribute to the received actual radio frequency field at either resonance frequency. Although these external tuning circuits are valuable for reversing the modes, they cost in coil performance by adding to coil losses. Further, the Ballon design is complicated by the fact that one populates the inner turns with capacitors to dominate the currents at the phosphorous resonance frequency. This design is not amenable to use in simultaneous proton decoupling x-nucleus spectroscopy or in simultaneous and interleaved multi-nuclear chemical-shift experiments. See, "Proton-Decoupled $^{31}$P Chemical-Shift Imaging of the Human Brain in Normal Volunteers", Murphy-Boesch, et al., NMR in BioMed. 6, 173–180 (1993) and "Simultaneous and Interleaved Multi-Nuclear Chemical-Shift Imaging: A Method For Concurrent, Localized Spectroscopy", Gonen, et al., J. Mag. Res. Series B, 104, 26–33 (1994).

The present application describes a new and improved doubly-resonant radio frequency coil which overcomes the above-referenced problems and others.

SUMMARY OF THE INVENTION

In accordance one aspect of the present invention, a magnetic resonance apparatus is provided. A magnet generates a temporally constant uniform magnetic field through an examination. At least one multiply-tuned radio frequency coil transmits radio frequency signals into the examination region to induce and manipulate resonance of first, higher $\gamma$ dipoles and to receive first resonance frequency signals from the first dipoles and second resonance frequency signals from the second dipoles. A processor processes the received magnetic resonance signals. The radio frequency coil includes a first coil portion that has first and second legs disposed in parallel and electrically interconnected. The first coil portion has an inherent inductance and added capacitance such that it is tuned near the first resonance frequency.

A third leg disposed in parallel to the first leg and electrically interconnected with the first leg defines a second coil portion. A fourth leg disposed parallel to the second leg and electrically connected with the second leg defines a third coil portion. The third and fourth legs have added capacitance such that the first, second, third and fourth legs taken together resonate in at least of a co-rotating and a counter-rotating mode near the second resonance frequency.

In accordance with a more limited aspect of the present invention, the multiply-tuned radio frequency coil is curved onto the surface of a cylinder.

In accordance with another more limited aspect of the present invention, the multiply-tuned radio frequency coil is planar.

In accordance with another aspect of the present invention, a multiply-tuned radio frequency coil is tuned to receive radio frequency magnetic resonance signals of at least a first resonance frequency and a second resonance frequency simultaneously. An inner coil section is tuned with its inherent inductance and added first capacitive elements substantially to the first resonance frequency. A first outer coil section and a second outer coil section are connected with opposite sides of the inner coil section. The first and second outer coil sections have added second capacitive elements. The second capacitive elements are sized relative to the inherent inductance of the inner coil section and the first and second outer coil sections, the first capacitive elements, and the coil size geometry to tune the coil defined by the inner and the first and second outer coil sections operating together in one of a co-rotating and a counter-rotating mode to the second resonance frequency. The second capacitive elements are sized such that at the first resonance frequency, radio frequency current flow through the inner coil section is much larger than the radio frequency current flow through the outer coil sections. In this manner, the multiply-tuned radio frequency coil is tuned to the first and second resonance frequencies without added traps.

In accordance with a more limited aspect of the present invention, the inner coil section is defined by first and second legs and an electrical connection therebetween. The first outer coil section is defined by a third leg, the first leg, and an electrical interconnection therebetween. The second outer coil section is defined by a fourth leg, the second leg, and an electrical interconnection between the third and fourth legs.

In accordance with another aspect of the present invention, the first, second, third, and fourth legs are loops or rings such that the multiply-tuned radio frequency coil is solenoidal.

In accordance with another more limited aspect of the present invention, the first, second, third, and fourth legs are linear such that the multiply-tuned radio frequency coil is planar.

In accordance with another aspect of the present invention, a method of magnetic resonance imaging is provided. A temporally constant uniform magnetic field is generated through an examination region. Radio frequency signals are transmitted into the examination region to induce and manipulate magnetic resonance of first dipoles which resonate at a first frequency and second dipoles which resonate at a second frequency. First resonance signals and second resonance signals are received from the resonating first and second dipoles in the examination region. Magnetic field gradients are applied across the examination region. The received first and second frequency signals are pro- cessed into image representations. The first and second resonance frequency signals are received simultaneously with a multiply-tuned radio frequency coil which is free of added trap circuitry.

In accordance with a more limited aspect of the present invention, the multiply-tuned radio frequency coil has a low frequency mode at the first resonance frequency, a co-rotating mode, and a counter-rotating mode. One of the co-rotating and counter-rotating modes is at the second resonance frequency.

In accordance with another more limited aspect of the present invention, the first resonance frequency is the resonance frequency of one of phosphorous, carbon, nitrogen, xenon, or iodine within the temporally constant magnetic field. The second resonance frequency provides a homogeneous field at the hydrogen or protons frequency in a co-rotating or a counter-rotating mode within the temporally constant magnetic field. The third, radio frequency gradient mode is internally or externally switchable for rotating frame of reference experiments.

In accordance with another aspect of the invention, the coil has a tuning mode for rotating the coordinates of the region of interest.

In accordance with another aspect of the present invention, unique current distributions are created in the co-rotating mode.

In accordance with another aspect of the present invention, both surface and volume coils can be multiply-tuned.

In accordance with another aspect of the present invention, additional degrees of design freedom including varying coil geometry (by varying dimensions, impedance, and the like) permits optimization of the signal-to-noise ratio and the $B_1$ profile.

One advantage of the present invention is that it provides simultaneous operation at multiple frequencies.

Another advantage of the present invention is that the coil has a signal-to-noise ratio and a coverage at low $\gamma$ nucleus, e.g., phosphorous, that is comparable to a single-tuned coil of similar dimension.

Another advantage of the present invention is that a high frequency co-rotating or counter-rotating mode provides a uniform $B_1$ radio frequency field over and beyond the low frequency mode field-of-view.

Another advantage of the present invention resides in additional degrees of freedom in coil design for optimizing the signal-to-noise ratio, the $B_1$ field profile, and the like.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

FIG. 1 is a diagrammatic illustration of a magnetic resonance imaging system in accordance with the present invention;

DETAILED DESCRIPTION OF THE PREFERRED EMBODIMENTS

Figure 2A:
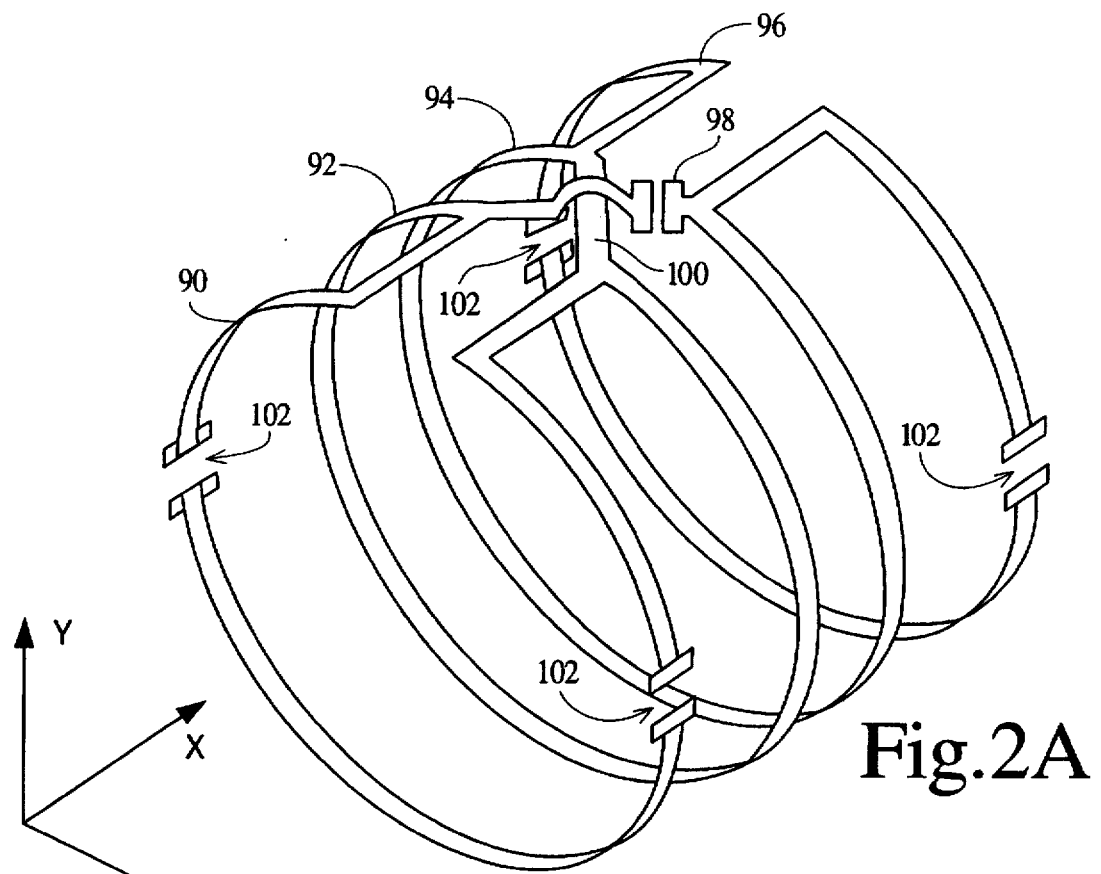
FIG. 2A is a perspective view of the multiply-tuned coil of FIG. 1.

With reference to FIG. 1, a plurality of primary magnetic coils 10 generate a uniform, temporally constant magnetic field $B_O$ along a longitudinal or z-axis of a central bore 12. In a preferred superconducting embodiment, the primary magnet coils are supported by a former 14 and received in a toroidal helium vessel or can 16. The vessel is filled with helium to maintain the primary magnet coils at superconducting temperatures. The can is surrounded by a series of cold shields 18 which are supported in a vacuum dewar 20. Of course, annular resistive magnets, C-magnets, and the like are also contemplated.

A whole body gradient coil assembly 30 includes x, y, and z-coils mounted along the bore 12 for generating gradient magnetic fields, $G_x$, $G_y$, and $G_z$. Preferably, the gradient coil assembly is a self-shielded gradient coil that includes primary x, y, and z-coil assemblies 32 potted in a dielectric former and secondary x, y, and z-coil assemblies 34 that are supported on a bore defining cylinder of the vacuum dewar 20. A whole body radio frequency coil 36 is mounted inside the gradient coil assembly 30. A whole body radio frequency shield 38, e.g., copper mesh, is mounted between the whole body RF coil 36 and the gradient coil assembly 30.

A multiply-tuned radio frequency coil 40 is removably mounted in the bore of the examination region defined around the isocenter of the magnet 10. The multiply-tuned coil is sized of the appropriate diameter to surround a region of interest of a patient or object undergoing examination.

An operator interface and control station 50 includes a human-readable display, such as a video monitor 52, and an operator input means including a keyboard 54, a mouse 56, a trackball, light pen, or the like. A computer control and reconstruction module 58 includes hardware and software for enabling the operator to select among a plurality of preprogrammed magnetic resonance sequences that are stored in a sequence control memory. A sequence controller 60 controls gradient amplifiers 62 connected with the gradient coil assembly 30 for causing the generation of the $G_x$, $G_y$, and $G_z$ gradient magnetic fields at appropriate times during the selected gradient sequence and a digital transmitter 64 which causes a selected one of the whole body and insertable radio frequency coils to generate $B_1$ radio frequency field pulses at times appropriate to the selected sequence. The excitation pulses are preferably tuned to the resonance frequencies of the selected dipoles of interest.

The higher frequency, $^1H$ resonance frequency signals are demodulated by a first digital receiver 66 and stored in a data memory 68. The lower frequency resonance signals, such as the $^{31}P$ resonance signals are received by a second receiver 68 and stored in a second data memory 72. Of course, the first and second data memories may be portions of a large mass memory. Data from the data memories are reconstructed by a reconstruction or array processor 74 into corresponding volumetric image representations that are stored in corresponding portions of an image memory 76. Again, the image memory may be part of a common mass memory. The two volume images or selected portions of them are adjustably weighted and combined by a video processor 78 under operator control. The selected, relatively weighted portions of the images, such as slice images, projection images, perspective views, or the like, as is conventional in the art, are displayed on the video monitor 52.

Figure 2B:
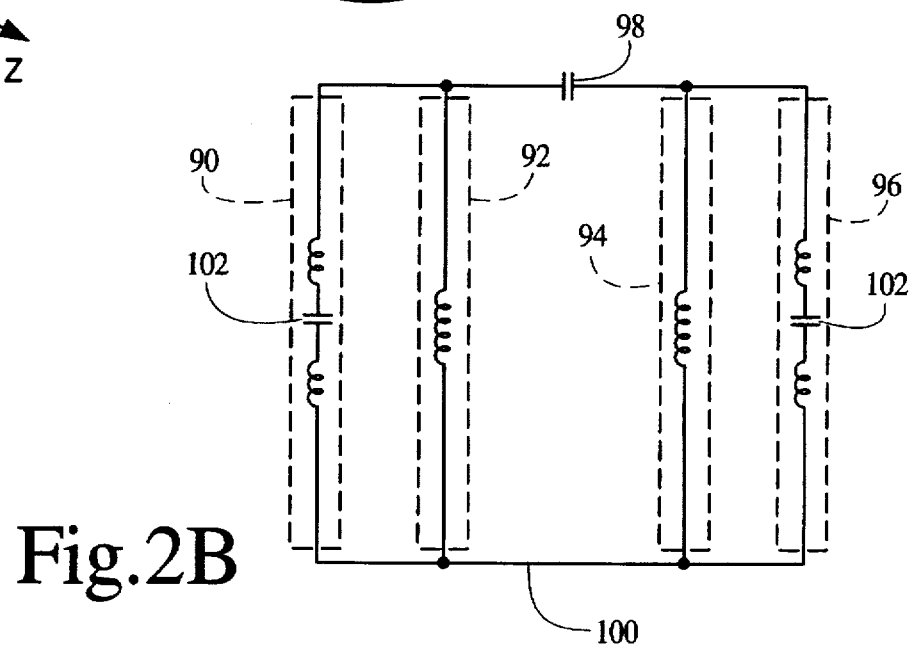
FIG. 2B is an equivalent circuit for the coil of FIG. 2A.

With particular reference to FIGS. 2A and 2B, the multiply-tuned coil 40 includes four turns or rings 90, 92, 94, and 96. The end rings 90 and 92 are connected in parallel as are the opposite end rings 94, 96. The two parallel connected rings are interconnected by a capacitor 98 and an electrical conductor 100. Note that the equivalent circuits of FIG. 2B is laid flat and are not crossed. Hence, currents in the equivalent circuit which appears to flow down on one side of the cross-over and up on the other are circulating through the coil of FIG. 2A in the same direction.

The inner legs 92, 94 and the capacitor 98 form a tuned coil loop. The magnitude of the capacitor 98 is selected relative to the inherent inductance in loops and 94, the physical dimensions of the coil, and the like such that the inner coil is resonant at a first preselected frequency, such as a frequency of about 24 MHz, i.e., near the resonant frequency of $^{31}P$ in a 1.5 T magnetic field. The outer loops 90, 96 have added capacitors 102 which are sized relative to the inherent inductance of all four loops, the coil geometry, and the like, such that in one of a co-rotating mode and a counter-rotating mode, the coil has a resonance frequency of about 64 MHz, i.e., near the resonant frequency of $^1H$ in a 1.5 T magnetic field. Alternately, the geometry of the coil can be adjusted to adjust the resonant frequencies. For example, physical dimensions can be changed, numbers of loops changed, impedance properties of the coil, and the like.

Figure 3A:
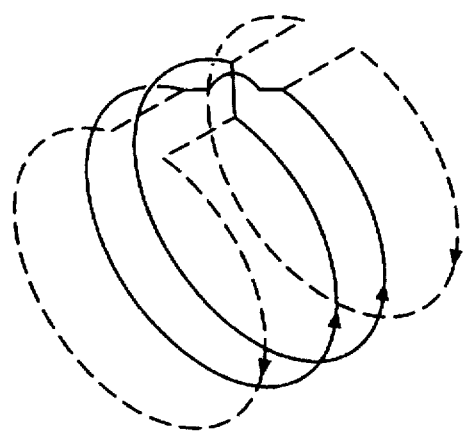
FIG. 3A illustrates current distribution in the coil of FIG. 2A in a low γ dipole, e.g., phosphorous, resonance mode.
Figure 3B:
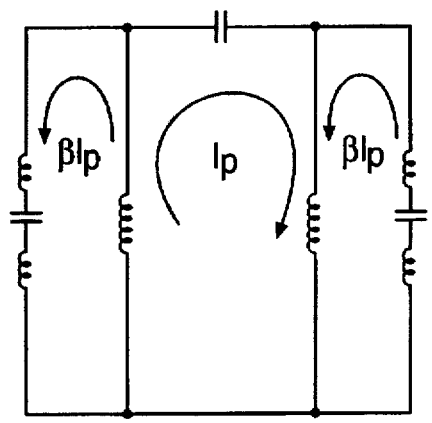
FIG. 3B illustrates current distribution in the equivalent circuit of FIG. 2B in the low γ dipole resonance mode.
Figure 6A:
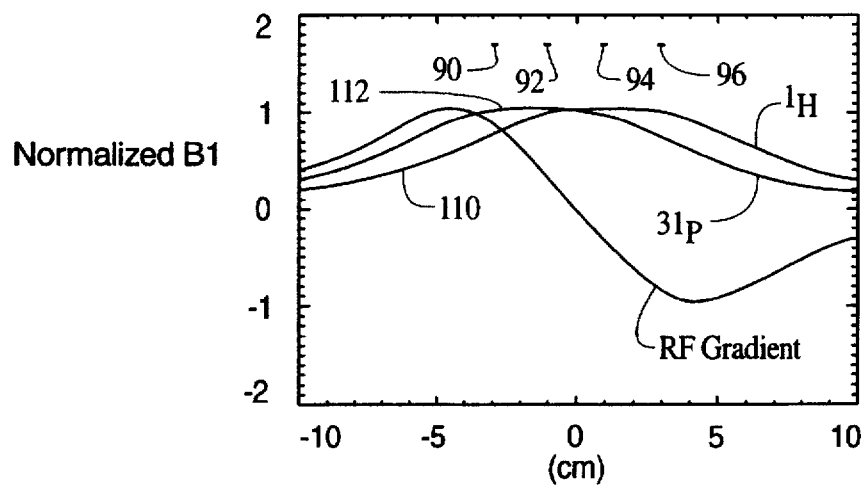
FIGS. 6A, 6B, and 6C illustrate the normalized Ba field along the coil axes of FIG. 2A with different separations between the coil turns.

With reference to FIGS. 3A and 3B, at the phosphorous resonant frequency, currents flow substantially within the center loop defined by legs or loops 92 and 94 with only a minor current flow through the outer legs or loops 90, 96. Normally, the current in the outer loops is about 1/10th the magnitude of current in the center loops. This produces a $B_1$ response along the axis as illustrated by curve 110 of FIG. 6A, when all the loops are spaced by 2 cm. This helps maintain the signal intensity to within a few percent at the coil center and the coil profile comparable with a single-tuned coil. At the phosphorous frequency, the currents in the outer turns are 180° out-of-phase with respect to the inner turns. As will be seen in FIGS. 6B and 6C and TABLE 1, as the outer rings are spaced further from the inner rings, there is relatively little effect on the response to the 24 MHz signals.

TABLE 1

$B_1$ Signal Intensity at Coil Center

| Coil Length | Turn Spacing | $B_1$ - Double-Tuned | | $B_1$ - Single-Tuned | |
| --- | --- | --- | --- | --- | --- |
| | | $^{31}$P | $^1$H | $^{31}$P | $^1$H |
| 10 cm | 4-2-4 cm | 19.2 uT | 7.49 uT | 20.1 uT | 49.7 uT |
| 08 | 3-2-3 cm | 18.9 | 10.1 | 20.1 | 52.3 |
| 06 | 2-2-2 cm | 18.6 | 13.0 | 20.1 | 55.2 |

Figure 4A:
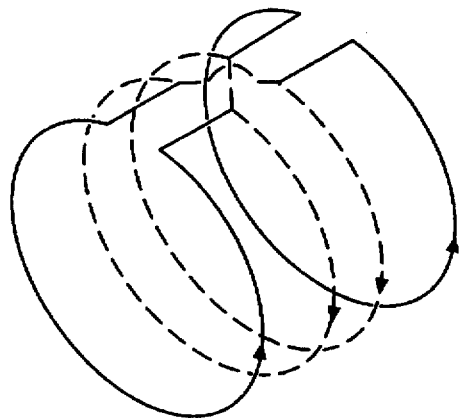
FIG. 4A illustrates current distributions in the coil of FIG. 2A in a co-rotating mode.
Figure 4B:
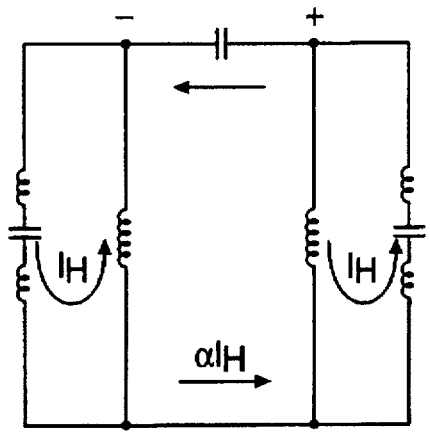
FIG. 4B illustrates current distribution in the equivalent circuit of FIG. 2B in the co-rotating mode.
Figure 6B:
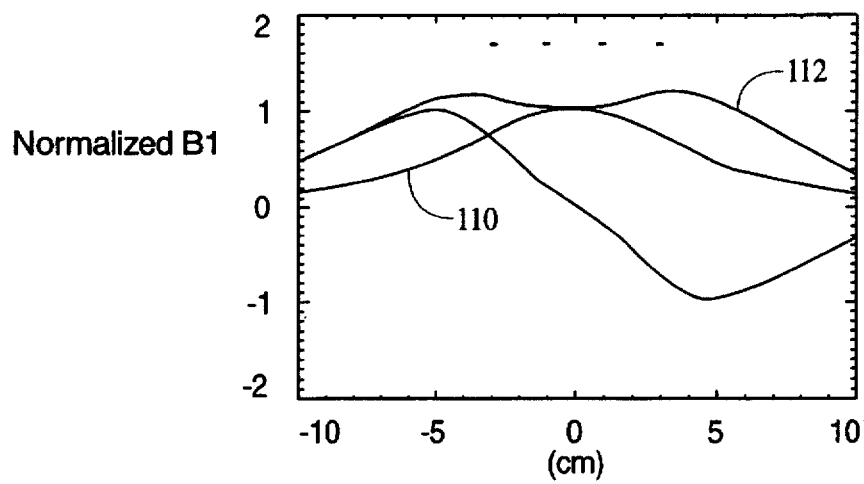
Figure 6C:
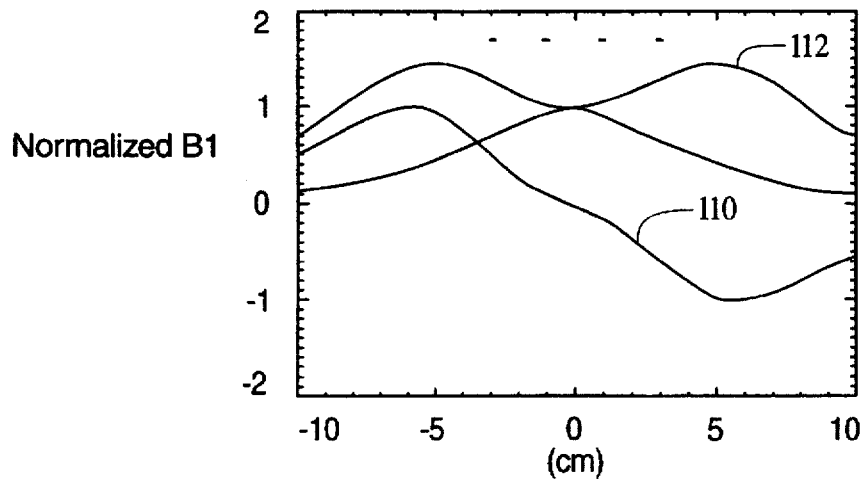

As illustrated in FIGS. 4A and 4B, in the co-rotating mode, the current flow in the outer two loops is substantially the same with only a minor flow in the inner loops causing a relatively flat, wide $B_1$ uniform field response 112 across the coil. Typically current flow in the center loops is about 1/10th the current flow in the outer loop. As shown in FIGS. 6B and 6C and TABLE 1, as the separation between the end rings and the center rings are increased, edge sensitivity to the 64 MHz $B_1$ field increases. Of course, the FIG. 4B mode can alternately be tuned to the low γ nucleus frequency.

Figure 5A:
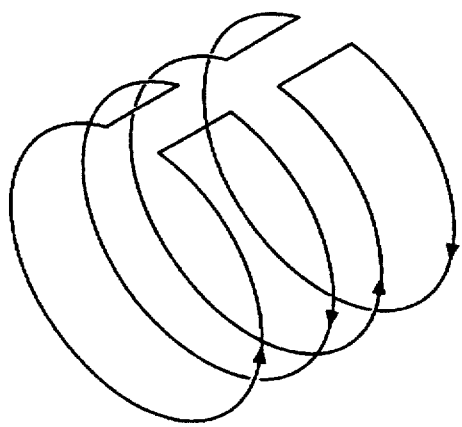
FIG. 5A illustrates current distributions in the coil of FIG. 2A in a counter-rotating mode.
Figure 5B:
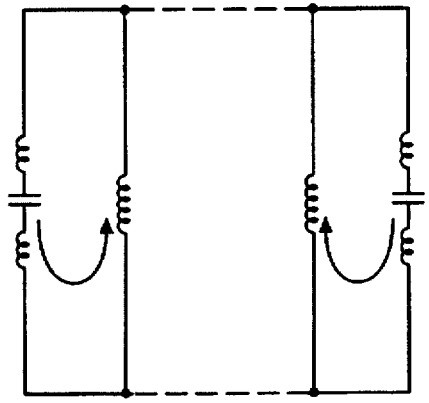
FIG. 5B illustrates current distribution in the equivalent circuit of FIG. 2B in the counter-rotating mode.

With reference to FIGS. 5A and 5B, in addition to the co-rotating and $^{31}$P modes, there is also a counter-rotating mode. In the counter-rotating mode, the currents in the two outer meshes are 180° out-of-phase with one another with substantially no net current flowing between the two inner rings. This provides a linear gradient along the coil and produces no net field at coil center. This gradient RF field is usable for rotating frame experiments. See Hoult, J. Mag. Res., 33, p. 183 (1979). Optionally, the counter-rotating mode can be tuned to the hydrogen or phosphorous frequencies.

Figure 7A:
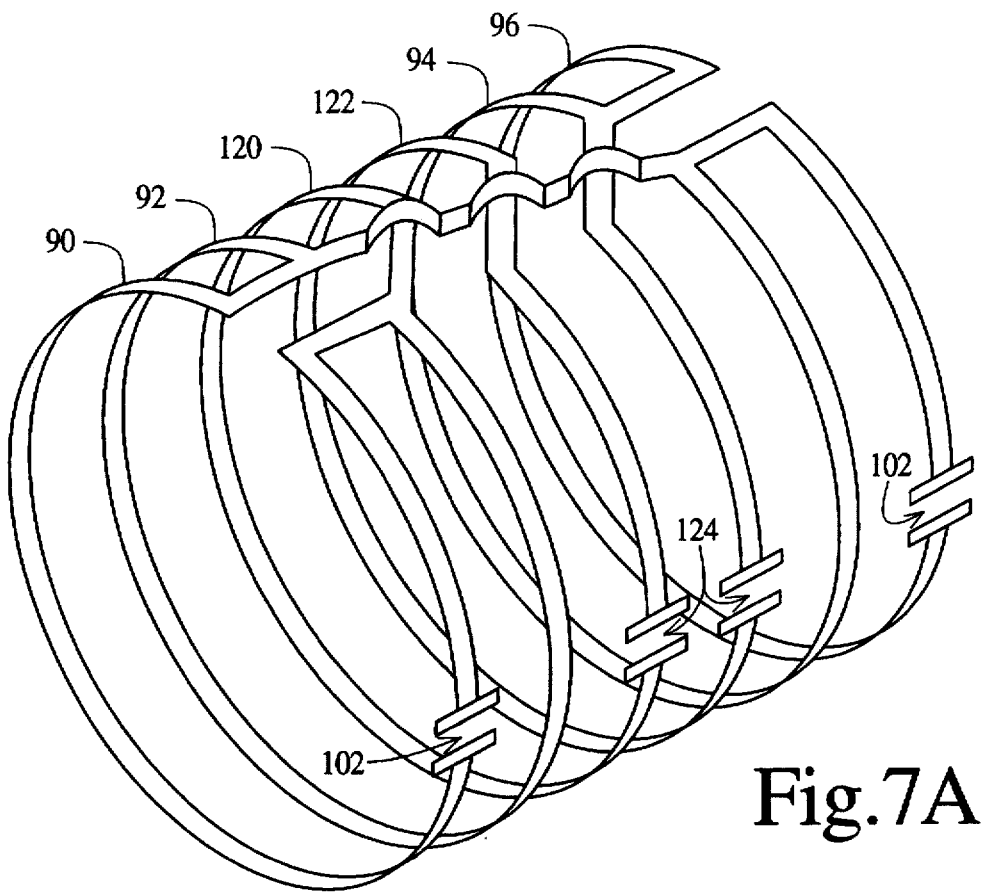
FIG. 7A illustrates an alternate embodiment of the present invention.
Figure 7B:
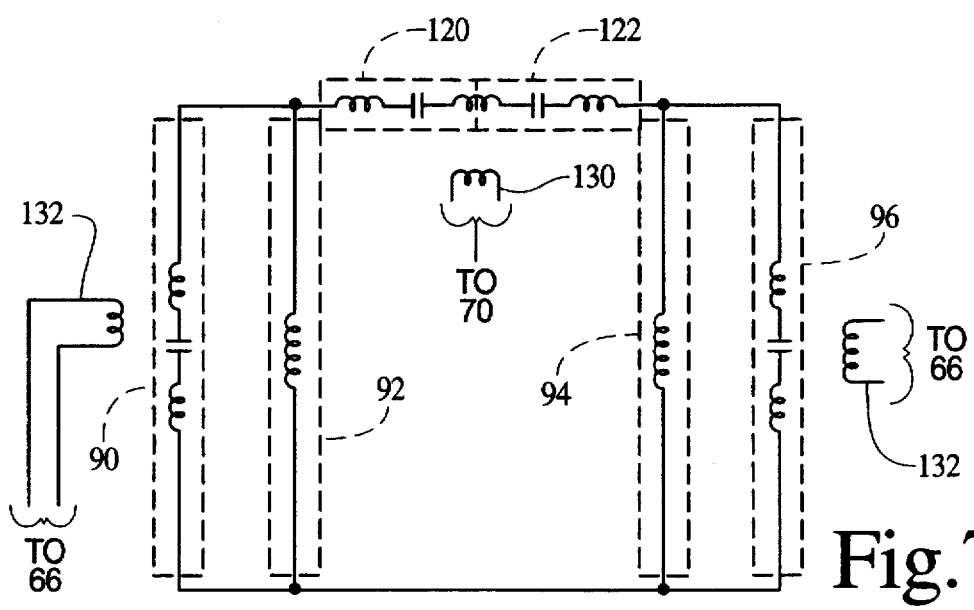
FIG. 7B is an equivalent circuit of the coil of FIG. 7A.

With reference to FIGS. 7A and 7B, additional windings or legs may be placed between the parallel connected outer turns. In the embodiment of FIG. 7A, two additional helical turns 120, 122 are provided. In the embodiment of FIGS. 7A and 7B, rings or legs 90 and 92 are connected in parallel as are rings 94 and 96. For a 12 cm diameter coil that is 12.5 cm long, the rings are spaced about 2.5 cm apart. With only rings 120 and 122 populated with 47 pf capacitors 124, one mode is observed at 24.4 MHz. When rings 90 and 96 are populated with 22 pf capacitors 102, three modes are observed at 23.95, 56.05, and 63.55 MHz. The $^{31}$P mode is shifted by approximately 0.5 MHz. In the preferred embodiment, the co-rotating mode appears at 63.55 MHz, and the counter-rotating mode appears at 56.05 MHz. The low frequency mode is retuned to 25.8 MHz to match the $^{31}$P resonant frequency of phosphorous more closely. The high order co-rotating mode is retuned to 64 MHz to match the hydrogen resonance frequency more closely. Rings 94 and 96 may be broken with large value capacitors to reduce any gradient induced eddy currents. Again, the modes can be tuned to different frequencies or the same frequencies can be tuned to other modes by adjusting the sizes of the capacitors or changing the inductive properties of the coil.

The receivers can be connected with the doubly-tuned coil through magnetic or electric couplings that are preferably matched to 50 Ohms. For example, a magnetic coupling 130 can be inductively connected to the coils 120, 122 to provide the phosphorous frequency resonance signals to the receiver 70. Analogously, a second pair of magnetic couplings are inductively coupled with the end loops 90, 96 to receive the hydrogen frequency resonance signals. The symmetric inductive couplings 134 are preferably combined and connected with the receiver 66. Other types of couplings are, of course, contemplated.

Figure 8A:
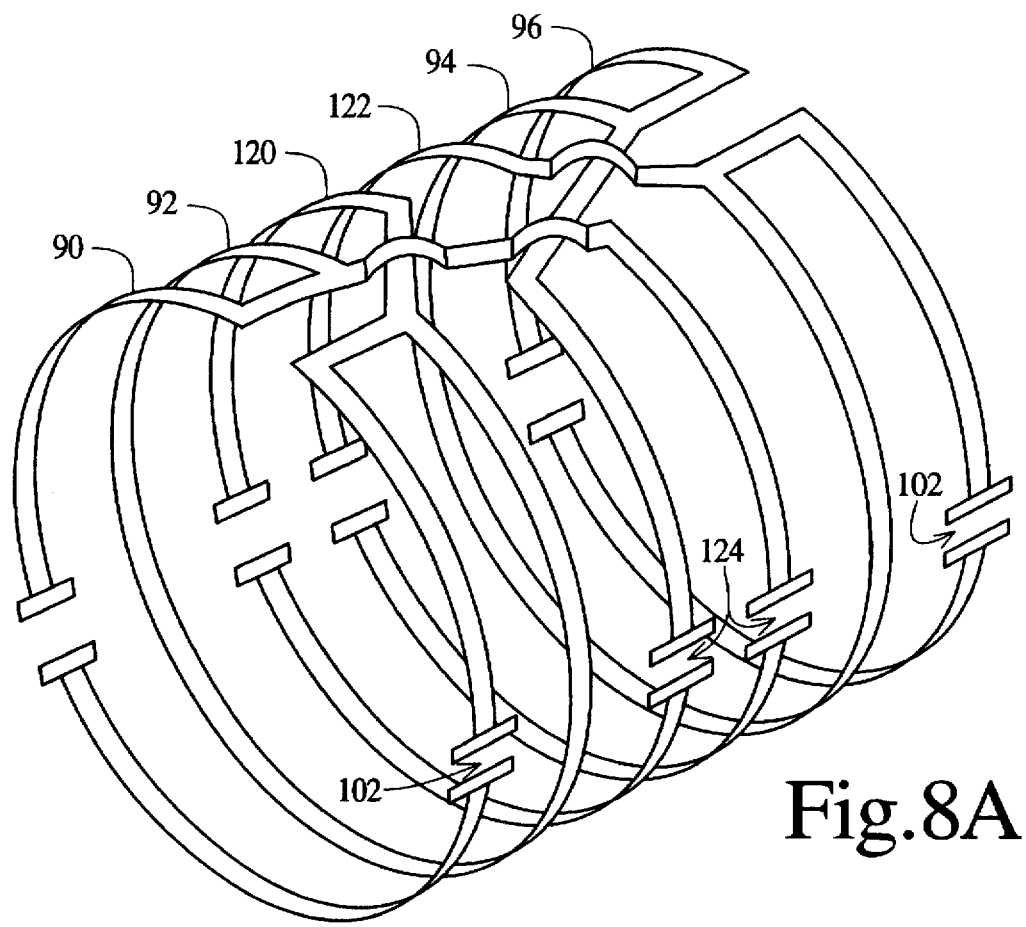
FIG. 8A illustrates another, alternate, solenoidal embodiment.
Figure 8B:
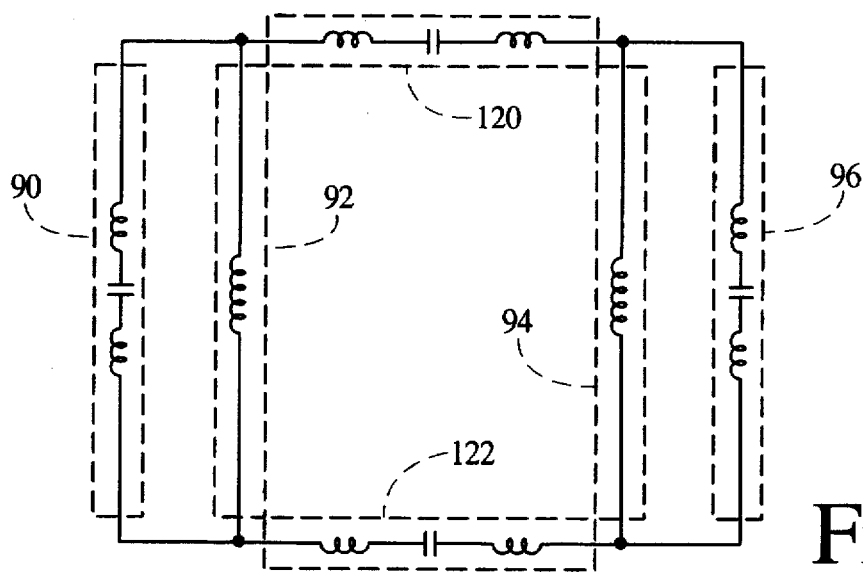
FIG. 8B is an equivalent circuit of the coil of FIG. 8A.
Figure 9:
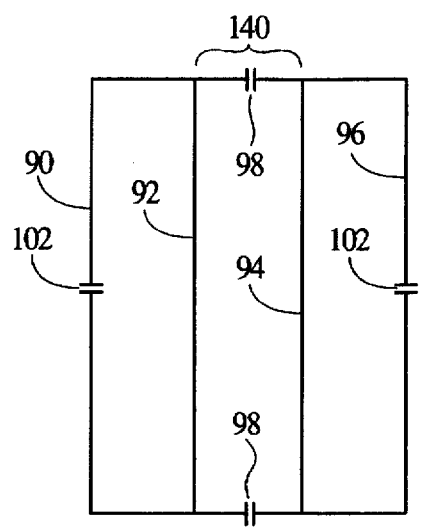
FIG. 9 illustrates an alternate, planar embodiment.
Figure 10:
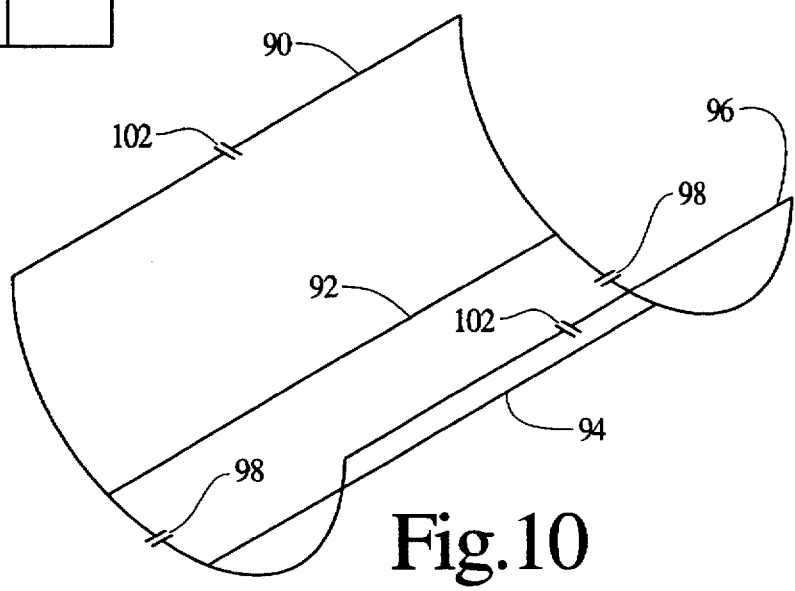
FIG. 10 illustrates a variation on the embodiment of FIG. 9 in which the coil is bent or arced; and, FIG. 11 illustrates yet another alternate embodiment.

With reference to FIGS. 8A and 8B, outer coil pairs 90, 92 and 94, 96 are again connected in parallel. Inner turns 120, 122 have a different cross-over pattern. The inner turns 120, 122 again have tuning capacitances In the embodiment of FIG. 9, an inner phosphorous frequency loop 140 is defined by legs 92, 94 and by interconnecting capacitors 98. The size of the capacitors is selected relative to the inherent inductance of this loop such that the loop has a resonance frequency at or near the resonance frequency of the low γ dipole, e.g., phosphorous, to be imaged. A pair of outer legs 96 define a pair of outer loops. Note that legs 90 and are again in parallel as are legs 92, 94. Capacitors are added to the outer legs. Again, the size of the capacitors is selected to produce a resonance frequency in one of the co-rotating and the counter-rotating mode which matches the other dipole to be imaged, e.g., hydrogen. In the embodiment of FIG. 9 in which the coil lays flat, the co-rotating mode is tuned to the high γ dipole resonance frequency. In the embodiment of FIG. 10 in which the coil is arced along a semi-circular arc, the counter-rotating mode is tuned to the high γ frequency. In the embodiment of FIG. 10, the high and low γ modes are orthogonal to each other.

Figure 11:
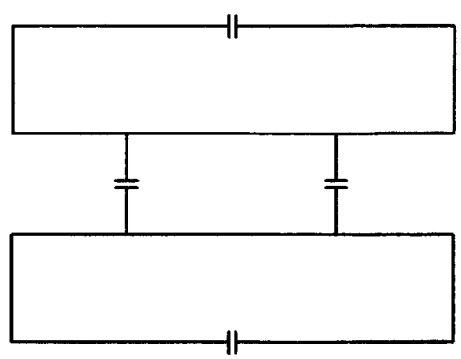

As illustrated in FIG. 11, the inner low γ dipole frequency loop may be a different size from the outer, high γ dipole loops. Again, the construction of FIG. 11 may be flat as in FIG. 11 or curved as in FIG. 10.

The above-described coils can be overlapped, preferably to a point of minimum mutual inductance with like coils or other surface volume coils. Such overlapped coils may be used individually or collectively, depending on the application, as is known in the art. These coils may further be overlapped with other coils, including surface coils, volume coils, single-tuned coils, multiply-tuned coils, or the like, in an array configuration. The coils may be used for imaging of both dipoles or for imaging of one and spectroscopic examination of the other. With separate pick-ups for the high and low γ signals, the high and low γ magnetic resonance frequency signals are preferably generated simultaneously, yet received independently. The coil may be used for receive-only, transmit-only, or transmit and receive purposes. The coil may also be used either alone or in conjunction with local gradient coils for high resolution or rapid imaging.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. In a magnetic resonance apparatus which includes a magnet for generating a temporally constant uniform magnetic field through an examination region, at least one multiply-tuned radio frequency coil which performs at least one of (1) transmitting radio frequency signals into the examination region to induce and manipulate resonance of first, higher γ dipoles and second, lower γ dipoles disposed in the examination region, and (2) receiving first resonance frequency signals from the first dipoles and second resonance frequency signals from the second dipoles, and a processor for processing the received magnetic resonance signals, the at least one multiply-tuned radio frequency coil comprising:

a first coil portion having first and second legs disposed in parallel and electrically interconnected to define the first coil portion, the first coil portion having an inherent inductance and added capacitance such that it is tuned near the first resonance frequency of the low γ dipoles;

a third leg disposed parallel to the first leg and electrically interconnected with the first leg to define a second coil portion;

a fourth leg disposed parallel to the second leg and electrically connected with the second leg defines a third coil portion, the third and fourth legs having added capacitance such that the first, second, third, and fourth legs, taken together, resonate in at least one of a co-rotating and a counter-rotating mode near the second resonance frequency of the high γ dipoles.

2. In the magnetic resonance apparatus as set forth in claim 1, the multiply-tuned radio frequency coil being curved to contour to a selected body region.

3. In the magnetic resonance apparatus as set forth in claim 1, wherein the first, second, third, and fourth legs extend around a cylindrical region such that the multiply-tuned radio frequency coil is generally solenoidal.

4. In the magnetic resonance apparatus as set forth in claim 3, the multiply-tuned radio frequency coil further including fourth and fifth legs disposed parallel to and interconnecting the first and second legs such that the low γ frequency coil has at least four legs.

5. A multiply-tuned radio frequency coil tuned to receive radio frequency magnetic resonance signals of at least a first resonance frequency and a second resonance frequency simultaneously, the multiply-tuned radio frequency coil comprising:

an inner coil section tuned with its inherent inductance and added first capacitive elements substantially to the first resonance frequency;

a first outer coil section and a second outer coil section connected with opposite sides of the inner coil section, the first and second outer coil sections having added second capacitive elements therein, which second capacitive elements are sized relative to inherent inductance in the inner coil section and the first and second outer coil sections, the first capacitive elements in the inner coil section, and coil size and geometry to tune a coil defined by the inner and the first and second outer coil sections operating together in one of a co-rotating and counter-rotating mode to the second resonance frequency, the second capacitive elements in the first and second outer coil sections further being sized such that at the first resonance frequency, radio frequency current flow through the inner coil section is much larger than radio frequency current flow through the first and second outer coil sections, whereby the multiply-tuned radio frequency coil is tuned to the first and second resonance frequencies without added traps.

6. The multiply-tuned radio frequency coil as set forth in claim 5 wherein the inner coil section includes first and second annular loops electrically connected in series; and, the first outer coil section is defined by a third annular loop which is electrically connected electrically in parallel with the first annular loop and the second outer coil section is defined by a fourth annular loop that is connected electrically in parallel with the second annular loop.

7. The multiply-tuned radio frequency coil as set forth in claim 6 wherein capacitive elements are disposed only in the third and fourth annular loops and in an electrical interconnection between the first and second annular loops.

8. The multiply-tuned radio frequency coil as set forth in claim 6 wherein the first and second annular loops are electrically connected by at least one additional annular loop disposed between the first and second annular loops.

9. The multiply-tuned radio frequency coil as set forth in claim 6 wherein:

the inner coil section is defined by a first leg, a second leg, and electrical elements interconnecting the first and second legs;

the first outer coil section is defined by a third leg, the first leg, and an electrical interconnection between the first and second legs; and, the second outer coil section is defined by a fourth leg, the second leg, and an electrical interconnection between the second and fourth legs.

10. The multiply-tuned radio frequency coil as set forth in claim 9 further including capacitive elements connected in the third and fourth legs and the electrical circuitry interconnecting the first and second legs.

11. The multiply-tuned coil as set forth in claim 10 wherein the capacitive elements are sized such that in a low frequency mode, the multiply-tuned coil is tuned to a resonance frequency of one of phosphorous, carbon, nitrogen, xenon, and iodine, and in one of the co-rotating and counter-rotating modes, is tuned to a resonance frequency of hydrogen.

12. The multiply-tuned radio frequency coil as set forth in claim 10 wherein the first, second, third, and fourth legs lie parallel to each other in a common plane.

13. The multiply-tuned radio frequency coil as set forth in claim 10 wherein the first, second, third, and fourth legs are disposed parallel to each other circumferentially around a cylinder.

14. The multiply-tuned radio frequency coil as set forth in claim 10 wherein the first, second, third, and fourth legs extend along a surface of a cylinder parallel to each other and parallel to a central longitudinal axis of the cylinder.

15. The multiply-tuned resonance coil as set forth in claim 10 further including additional legs disposed between the first and second legs.

16. The multiply-tuned radio frequency coil as set forth in claim 5 wherein the other of the co-rotating and counter-rotating modes is tuned to a third frequency.

17. A multiply-tuned radio frequency magnetic resonance imaging coil comprising:

a first coil portion tuned in a first mode to a first radio frequency and having a substantially uniform $B_1$ field over a first field-of-view;

a second coil portion connected with the first coil portion and being tuned in a second mode to a second radio frequency, the second frequency being different from the first frequency, one of the first and second modes being a counter-rotating mode and the other being a co-rotating mode, at the second radio frequency, the coil having a substantially uniform $B_1$ field over a second field-of-view which second field-of-view is larger than the first field-of-view to improve image homogeneity, shimming over a larger region, and uniform decoupling over the second field-of-view.

18. The magnetic resonance imaging coil as set forth in claim 17 further including a third mode in which a radio frequency gradient provides a rotating frame of reference.

19. In a method of magnetic resonance imaging in which a temporally constant uniform magnetic field is generated through an examination region, radio frequency signals are transmitted into the examination region to induce and manipulate magnetic resonance of first dipoles which resonate at a first frequency and second dipoles which resonate with a second frequency, magnetic field gradients are applied across the examination region, and first resonance frequency signals and second resonance frequency signals are received from the resonating first and second dipoles in the examination region, and processed into image representations, the improvement comprising:

receiving the first and second resonance frequency signals simultaneously with a multiply-tuned radio frequency coil which is free of added trap circuitry, the multiply-tuned radio frequency coil having (i) a low frequency mode at the first resonance frequency, (ii) a co-rotating mode, and (iii) a counter-rotating mode, one of the co-rotating and counter-rotating modes being at the second resonance frequency.

20. In the method as set forth in claim 19, the improvement further comprising:

the first resonance frequency being the resonance frequency for one of phosphorous, carbon, nitrogen, xenon, and iodine within the temporally constant magnetic field; and the second resonance frequency being the resonance frequency for hydrogen within the temporally constant magnetic field.

21. In the method as set forth in claim 19, the improvement further comprising:

in the low frequency mode, first magnetic resonance frequency signals circulating through an inner loop of the multiply-tuned coil, which inner loop is tuned substantially to the first resonance frequency with only much smaller magnitudes of first resonance frequency currents flowing through a pair of outer coils; and, substantially equal magnitudes of current of the second resonance frequency flowing through the inner loop and outer loops such that the first resonance frequency has a field-of-view commensurate with the inner coil and at the second resonance frequency the multiply-tuned coil has a field-of-view commensurate with the inner and outer loops taken together.

22. In a method of magnetic resonance imaging in which a temporally constant uniform magnetic field is generated through an examination region, radio frequency signals are transmitted into the examination region to induce and manipulate magnetic resonance of first dipoles which resonate at a first frequency and second dipoles which resonate with a second frequency, first resonance frequency signals and second resonance frequency signals are received from the resonating first and second dipoles in the examination region, magnetic field gradients are applied across the examination region, and the received first and second frequency signals are processed into image representations, the improvement comprising:

tuning a multiply-tuned radio frequency coil which is free of added trap circuitry to (1) a first mode at a first resonance frequency, (2) a second mode at the second resonance frequency, and (3) a third mode at a third frequency, one of the modes being a co-rotating mode and one of the modes being a counter-rotating mode;

receiving the first and second resonance frequency signals simultaneously with the multiply-tuned radio frequency coil.

23. In the method as set forth in claim 22, the improvement further comprising:

the third mode providing a rotating frame of reference.

24. In the method as set forth in claim 22, the improvement further comprising:

in the tuning step, adjusting at least one of a geometry, size, and shape of the coil and its impedance.

* * * * *